United States Patent
Yoshioka

(10) Patent No.: US 11,922,890 B2
(45) Date of Patent: Mar. 5, 2024

(54) SIGNAL LINE DRIVE CIRCUIT

(71) Applicant: Sony Semiconductor Solutions Corporation, Kanagawa (JP)

(72) Inventor: Masaki Yoshioka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/020,739

(22) PCT Filed: Sep. 29, 2021

(86) PCT No.: PCT/JP2021/035875
§ 371 (c)(1),
(2) Date: Feb. 10, 2023

(87) PCT Pub. No.: WO2022/075150
PCT Pub. Date: Apr. 14, 2022

(65) Prior Publication Data
US 2023/0298533 A1 Sep. 21, 2023

(30) Foreign Application Priority Data
Oct. 7, 2020 (JP) .................................. 2020-169930

(51) Int. Cl.
*G09G 3/3291* (2016.01)
*G09G 3/3225* (2016.01)

(52) U.S. Cl.
CPC ......... *G09G 3/3291* (2013.01); *G09G 3/3225* (2013.01); *G09G 2300/0828* (2013.01);
(Continued)

(58) Field of Classification Search
None
See application file for complete search history.

(56) References Cited

U.S. PATENT DOCUMENTS 6,628,261 B1 * 9/2003 Sato .................... G09G 3/3685
345/99
8,169,384 B2 * 5/2012 Yamashita ........... G09G 3/3266
315/169.3
(Continued)

FOREIGN PATENT DOCUMENTS

JP    H10319908 A    12/1998
JP    2005234063 A    9/2005
(Continued)

OTHER PUBLICATIONS

International Search Report (PCT/ISA/210), International Application No. PCT/JP2021/035875, dated Dec. 28, 2021.

*Primary Examiner* — Amy Onyekaba
(74) *Attorney, Agent, or Firm* — Michael Best & Friedrich LLP

(57) ABSTRACT

A variation in a signal line voltage is suppressed.
A signal line drive circuit drives a plurality of signal lines, and the signal line drive circuit includes: a reference voltage generation unit that generates a reference voltage whose voltage level changes with time in a first period before the plurality of signal lines is driven; a current holding unit that is provided to correspond to the signal line and holds a current corresponding to a load of the signal line and a temporal change of the reference voltage; and a current control unit that causes the current held by the current holding unit to flow through the corresponding signal line in a second period after a lapse of the first period to generate a drive voltage of the signal line.

18 Claims, 7 Drawing Sheets

(52) U.S. Cl.
CPC ............... *G09G 2300/0842* (2013.01); *G09G 2310/0294* (2013.01); *G09G 2310/08* (2013.01); *G09G 2320/0233* (2013.01); *G09G 2330/021* (2013.01)

(56) References Cited

U.S. PATENT DOCUMENTS

| | | | | |
|---|---|---|---|---|
| 9,093,964 | B2 * | 7/2015 | Kawagoshi | H03F 3/45076 |
| 9,965,993 | B2 * | 5/2018 | Tamura | G09G 3/2092 |
| 2005/0099412 | A1 * | 5/2005 | Kasai | G09G 3/3275 |
| | | | | 345/694 |
| 2005/0116654 | A1 * | 6/2005 | Sato | G09G 3/3688 |
| | | | | 315/169.3 |
| 2009/0135113 | A1 * | 5/2009 | Taneda | H10K 59/131 |
| | | | | 345/76 |
| 2009/0256827 | A1 * | 10/2009 | Tanikame | G09G 3/3291 |
| | | | | 345/204 |
| 2012/0299899 | A1 * | 11/2012 | Yamauchi | G09G 3/3659 |
| | | | | 345/211 |
| 2014/0300330 | A1 * | 10/2014 | Sugiyama | H02M 3/156 |
| | | | | 323/271 |
| 2015/0130783 | A1 * | 5/2015 | Toyomura | G09G 3/3266 |
| | | | | 345/82 |
| 2017/0372658 | A1 * | 12/2017 | Tamura | G09G 3/3283 |
| 2018/0211605 | A1 | 7/2018 | Kim | |
| 2019/0385524 | A1 * | 12/2019 | Tamura | G09G 3/3233 |
| 2023/0095998 | A1 * | 3/2023 | Hashikaki | G09G 3/3233 |
| | | | | 345/204 |

FOREIGN PATENT DOCUMENTS

| | | |
|---|---|---|
| JP | 2005311591 A | 11/2005 |
| JP | 2006293289 A | 10/2006 |
| JP | 2010281864 A | 12/2010 |
| JP | 2018004720 A | 1/2018 |

* cited by examiner

SIGNAL LINE DRIVE CIRCUIT

TECHNICAL FIELD

Embodiments according to the present disclosure relate to a signal line drive circuit.

BACKGROUND ART

In a display and the like, a signal line drive circuit that drives a plurality of pixel circuits is used. In the signal line drive circuit, a method of driving a signal line by a plurality of voltage follower circuits is widely used. In this method, however, it is necessary to cause a bias current to flow through the voltage follower circuit including an amplifier circuit, and there is a problem that power consumption increases.

In order to reduce such a bias current, there is proposed a method of driving a plurality of pixel circuits with a desired signal line voltage by causing a constant current to flow through a capacitive load for a period according to display data (signal voltage) using a constant current source (see Patent Document 1).

CITATION LIST

Patent Document

Patent Document 1: Japanese Patent Application Laid-Open No. 2018-004720

SUMMARY OF THE INVENTION

Problems to be Solved by the Invention

In this method, however, for example, there is a problem that a write voltage varies due to a current variation caused by a characteristic variation such as mobility of a transistor serving as the constant current source. Furthermore, there is also a problem that, for example, the display quality of a display deteriorates due to such a variation in the write voltage (signal line voltage).

Therefore, the present disclosure provides a signal line drive circuit capable of suppressing a variation in a signal line voltage.

Solutions to Problems

In order to solve the problem described above, according to the present disclosure, provided is a signal line drive circuit driving a plurality of signal lines, the signal line drive circuit including:

a reference voltage generation unit that generates a reference voltage whose voltage level changes with time in a first period before the plurality of signal lines is driven;

a current holding unit that is provided to correspond to the signal line and holds a current corresponding to a load of the signal line and a temporal change of the reference voltage; and a current control unit that causes the current held by the current holding unit to flow through the corresponding signal line in a second period after a lapse of the first period to generate a drive voltage of the signal line.

The current holding unit and the current control unit may be provided for each of the plurality of signal lines.

The current holding unit may hold the current corresponding to a value obtained by multiplying the load of the corresponding signal line by a voltage change value per unit time of the reference voltage.

The reference voltage generation unit may generate the reference voltage whose voltage level changes linearly with time in the first period, and generate the reference voltage whose voltage level is constant in the second period.

The second period may have a time length unique to each of the signal lines, and the current control unit may cause the current to continuously flow through signal line in the second period to generate the drive voltage of the signal line.

The current control unit may switch whether or not to cause the current held in the current holding unit to flow through the corresponding signal line in accordance with logic of a pulse width modulation signal having a pulse width corresponding to a time length of the second period.

The pulse width modulation signal may have a pulse width corresponding to the drive voltage of the corresponding signal line.

The drive voltage of the signal line may be a gradation voltage of a pixel driven by the signal line, and the pulse width modulation signal may have a pulse width corresponding to the gradation voltage.

The current control unit may include two transistors which are connected in parallel, have conductivity types different from each other, and are turned on or off in synchronization with each other.

One of the two transistors may form a part of a source follower circuit.

The current holding unit may include:

a first capacitor that accumulates a charge corresponding to the current flowing in the first period; and a first transistor that causes the current to continuously flow through the signal line in the second period on the basis of the accumulated charge of the first capacitor.

The current holding unit may further include a switch that diode-connects the first transistor in the first period, and the first capacitor may accumulate a charge corresponding to the current flowing through the diode-connected first transistor.

The current holding unit may further include a second transistor cascode-connected to the first transistor, the second transistor may be set to an on state from the first period to the second period, and the switch may accumulate a charge, which corresponds to a current flowing through the diode-connected first transistor and second transistor, in the first capacitor in the first period.

The current holding unit may include:

an analog-to-digital conversion unit that converts the current corresponding to the temporal change of the reference voltage into a digital value;

a current storage unit that stores the digital value; and a digital-to-analog conversion unit that converts the digital value stored in the current storage unit into the current, and the current control unit may cause the current converted by the digital-to-analog conversion unit to flow through the corresponding signal line to generate the drive voltage of the signal line.

A plurality of the current holding units may be provided to correspond to the plurality of signal lines, and the plurality of current holding units may hold currents output from the reference voltage generation unit in parallel.

A voltage follower circuit that is connected between the reference voltage generation unit and the current holding unit and supplies the reference voltage to the current holding unit in the first period may be further provided.

An initial voltage setting unit that sets the signal line to a predetermined reference voltage in a third period until the second period starts after a lapse of the first period may be further provided.

The load may be a parasitic capacitance of each of the signal lines.

MODE FOR CARRYING OUT THE INVENTION

Hereinafter, embodiments of a signal line drive circuit will be described with reference to the drawings. Although main constituent portions of the signal line drive circuit will be mainly described hereinafter, the signal line drive circuit may have constituent portions and functions that are not illustrated or described. The following description does not exclude the constituent portions or functions that are not illustrated or described.

Furthermore, the drawings are schematic or conceptual, and ratios of the respective portions and the like are not necessarily the same as actual ones. In the specification and the drawings, elements similar to those described above with respect to the previously described drawings will be denoted by the same reference signs, and the detailed description thereof will be appropriately omitted.

First Embodiment

Figure 1:
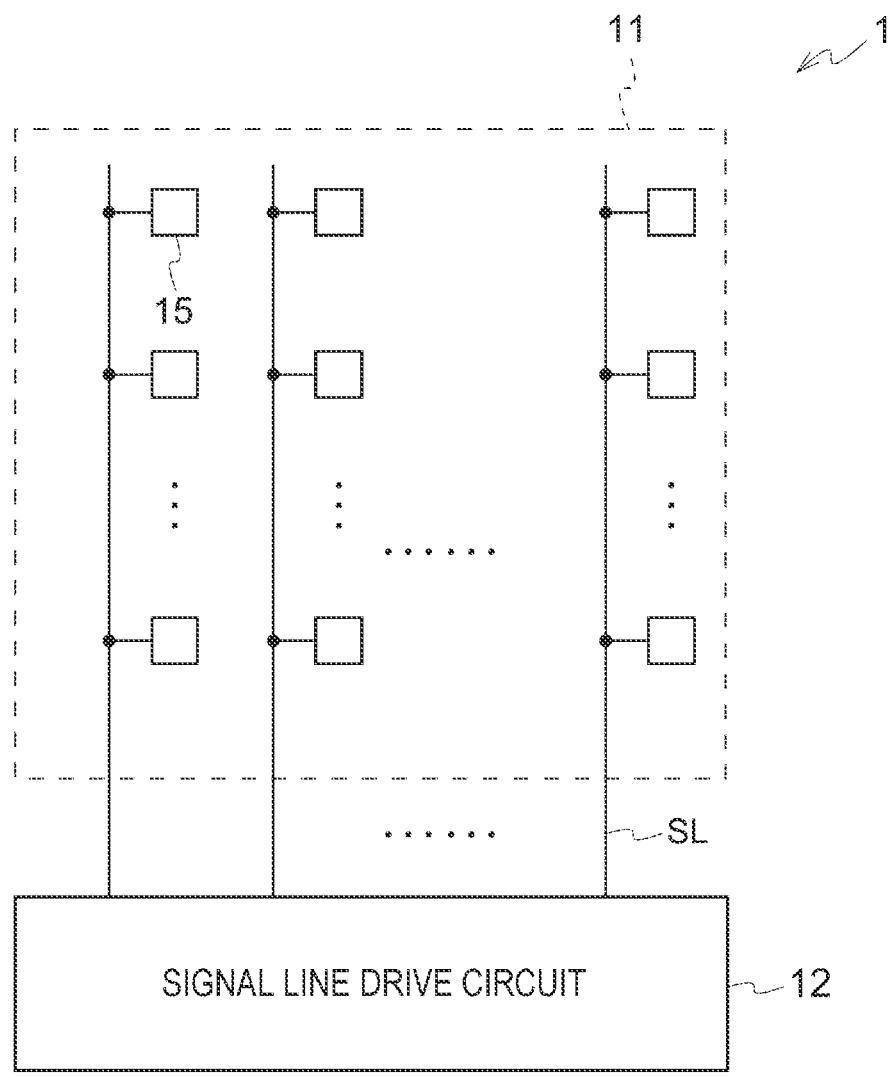
FIG. 1 is a block diagram illustrating a schematic configuration of a display device according to a first embodiment.

FIG. 1 is a block diagram illustrating a schematic configuration of a display device 1 according to a first embodiment. The display device 1 of FIG. 1 is, for example, a display device including a light emitting element such as an organic electroluminescence (EL) element (hereinafter, also referred to as an organic light emitting diode (OLED)). However, the display device 1 is not limited thereto, and may be another display device.

The display device 1 includes a pixel array unit 11, a signal line SL, and a signal line drive circuit 12.

The pixel array unit 11 includes a plurality of pixel circuits 15 arranged in the horizontal direction and the vertical direction. Each of the pixel circuits 15 includes, for example, a light emitting unit such as an organic EL element, a plurality of transistors that control the light emitting unit, and a plurality of capacitances. An internal configuration of the pixel circuit 15 will be described later.

The signal line drive circuit 12 drives a plurality of the signal lines SL. The signal line drive circuit 12 illustrated in FIG. 1 is provided in the display device 1 and used to drive the signal lines SL of the pixel circuits 15. However, the signal line drive circuit 12 is not limited thereto, may be used to drive another signal line. The signal line drive circuit 12 is preferably used in, for example, a device that drives a plurality of signal lines.

The signal line drive circuit 12 may perform signal processing of an image signal that needs to be displayed on the pixel array unit 11. A specific content of the signal processing is not limited, and is, for example, gamma correction or the like.

Figure 2:
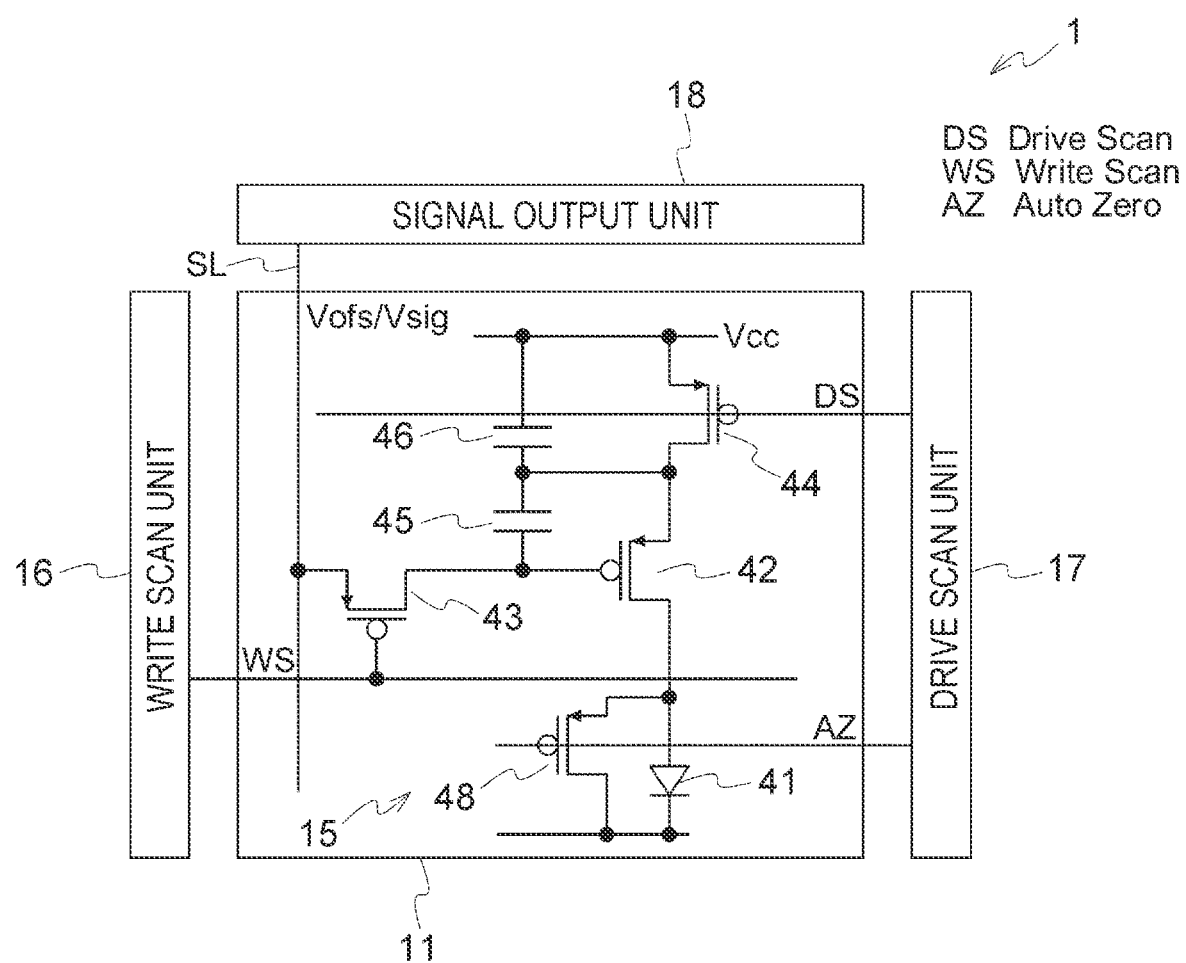
FIG. 2 is a circuit diagram illustrating an example of an internal configuration of a pixel circuit.

The signal line drive circuit 12 includes a write scan unit 16, a drive scan unit 17, and a signal output unit 18 as illustrated in FIG. 2 as described later.

When writing a signal voltage to each of the pixel circuits 15, the write scan unit 16 sequentially supplies a write scan signal to each scan line to sequentially drive each of scan lines WS1 to WSn.

The drive scan unit 17 supplies a light emission control signal to each drive line in synchronization with the line sequential scanning of the write scan unit 16, and controls light emission and non-light emission of the light emitting unit.

The signal output unit 18 holds a ramp wave voltage at a timing corresponding to s gradation of each pixel to generate a signal voltage. The signal output unit 18 selectively selects the signal voltage or an offset voltage Vofs and supplies the selected voltage to the corresponding signal line SL. The offset voltage Vofs is a voltage (for example, voltage corresponding to a black level of the image signal) serving as a reference of the signal voltage, and is used to perform a threshold correction operation as described later.

The signal voltage or the offset voltage Vofs selectively output from the signal output unit 18 is supplied to each of the pixel circuits 15 via the signal line SL, and is set in each of the pixel circuits 15 in a unit of a row selected by the scanning of the write scan unit 16.

FIG. 2 is a circuit diagram illustrating an example of an internal configuration of the pixel circuit 15. The pixel circuit 15 in FIG. 2 includes a light emitting unit 41 having an organic EL element, a driving transistor 42, a sampling transistor 43, a light emission control transistor 44, a holding capacitance (capacitor) 45, and an auxiliary capacitance (capacitor) 46. The pixel circuit 15 is formed on a semiconductor substrate such as silicon, and the driving transistor 42, the sampling transistor 43, and the light emission control transistor 44 are, for example, metal oxide semiconductor (PMOS) transistors. A power supply voltage is applied to a back gate of each of the transistors.

The sampling transistor 43 samples the offset voltage Vofs or a signal line voltage Vsig supplied from the signal output unit 18 via the signal line SL to write the sampled voltage in the holding capacitance 45. The light emission control transistor 44 is connected between a power supply node of a power supply voltage Vcc and a source electrode of the driving transistor 42, and controls light emission and non-light emission of the light emitting unit 41 under driving according to light emission control signal DS.

The holding capacitance 45 is connected between a gate electrode and the source electrode of the driving transistor 42. The holding capacitance 45 holds the signal line voltage Vsig written by sampling of the sampling transistor 43. The driving transistor 42 drives the light emitting unit 41 by causing a drive current corresponding to a holding voltage of the holding capacitance 45 to flow through the light emitting unit 41. The auxiliary capacitance 46 is connected between the source electrode of the driving transistor 42 and a node of a fixed potential, for example, the power supply node of the power supply voltage Vcc. The auxiliary capacitance 46 suppresses a fluctuation in a source potential of the driving transistor 42 when the signal line voltage Vsig is written, and performs action of adjusting a gate-source voltage Vgs of the driving transistor 42 to a threshold voltage Vth of the driving transistor 42.

The switching transistor 48 controls light emission of the light emitting unit 41. A signal AZ is input to a gate of the switching transistor 48, and the switching transistor 48 is turned on or off in accordance with logic of the signal AZ. While the switching transistor 48 is being turned on, the light emitting unit 41 stops the light emission. The switching transistor 48 is turned on in a period in which the threshold voltage and the offset voltage of the driving transistor 42 are corrected, and is turned off when the correction of the threshold voltage and the offset voltage is completed so that the light emission of the light emitting unit 41 is performed.

Figure 3:
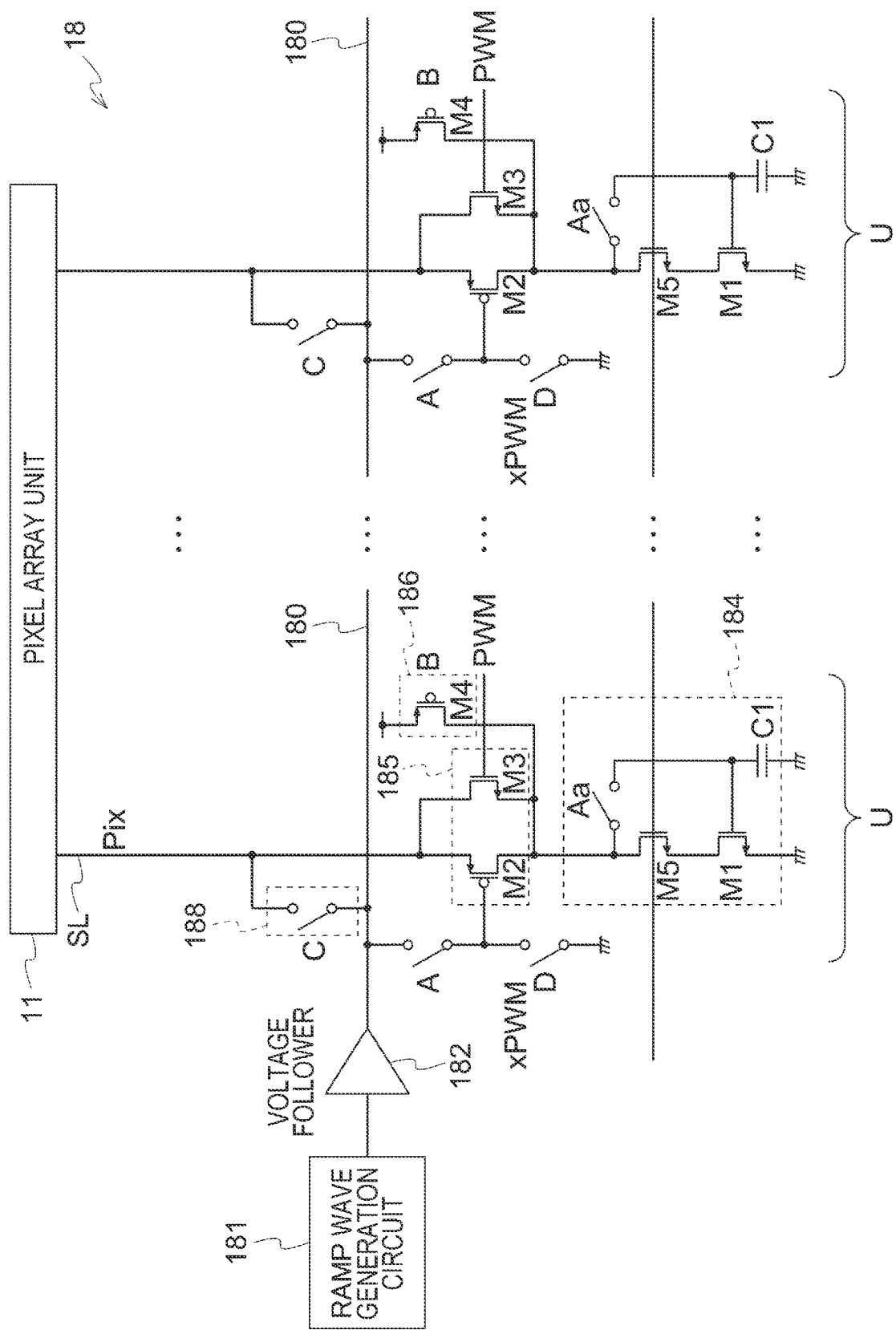
FIG. 3 is a circuit diagram illustrating an example of an internal configuration of a signal output unit.

FIG. 3 is a circuit diagram illustrating an example of an internal configuration of the signal output unit 18.

The signal output unit 18 includes a ramp wave generation circuit 181, a voltage follower circuit 182, a switch A, an xPWM switch D, a current holding unit 184, a current control unit 185, a voltage setting unit 186, and a reset unit 188.

The ramp wave generation circuit 181 as a reference voltage generation unit generates a reference voltage whose voltage level changes with time in a first period P1 before driving the plurality of signal lines SL. The first period P1 is a current sampling period illustrated in FIG. 4. The reference voltage is, for example, a ramp wave voltage whose voltage level continuously changes (see FIG. 4). The reference voltage is not limited to the ramp wave voltage, and is only required to be any voltage that changes at a substantially constant slope with time. Note that details of the first period P1 will be described later with reference to FIG. 4.

Hereinafter, an example in which the ramp wave generation circuit 181 generates a ramp wave voltage whose voltage level linearly changes with time in the first period P1 and generates a voltage whose voltage level is constant in a second period P2 will be mainly described.

The voltage follower circuit 182 is connected between the ramp wave generation circuit 181 and the current holding unit 184, and supplies the reference voltage to the current holding unit 184 in the first period P1. The voltage follower circuit 182 outputs the ramp wave voltage to a ramp wiring 180.

Note that the signal output unit 18 may further include an offset voltage generation circuit (not illustrated). In this case, the voltage follower circuit 182 switches between the offset voltage Vofs for performing threshold correction of the driving transistor 42 in the pixel circuit 15 and the ramp wave voltage whose voltage level continuously changes to be output to the ramp wiring 180.

A plurality of the switches A and a plurality of the reset units 188 are connected to the ramp wiring 180. The switch A, the xPWM switch D, the current holding unit 184, the current control unit 185, the voltage setting unit 186, and the reset unit 188 are drive units U corresponding to one signal line SL. Therefore, the plurality of drive units U corresponding to the plurality of signal lines SL is connected to the ramp wiring 180. That is, the current holding unit 184 and the current control unit 185 are provided for each of the plurality of signal lines SL.

The switch A is connected between the ramp wiring 180 and the current control unit 185.

The xPWM switch D is connected between the switch A and the current control unit 185, and a ground. For example, a signal at a level opposite to a pulse width modulation (PWM) signal input to the transistor M3, which will be described later, is input to the xPWM switch D.

The current control unit 185 is connected between the signal line SL and the current holding unit 184. The current control unit 185 includes a transistor M2 and the transistor M3. The transistor M2 is, for example, a p-type MOS transistor. The transistor M2 functions as a source follower. That is, the transistor M2 serves as a part of the current control unit 185 and a buffer unit. Note that details of the transistor M3 will be described later.

A gate of the transistor M2 is connected to the ramp wiring 180 via the switch A. Furthermore, the gate of the transistor M2 is connected to the ground via the xPWM switch D. A drain of the transistor M2 is connected to the current holding unit 184, and a source of the transistor M2 is connected to the signal line SL.

The transistor M3 is provided in parallel with the transistor M2. The current control unit 185 including the transistors M2 and M3 switches whether or not to cause a current held in the current holding unit 184 to flow to a corresponding signal line SL in accordance with logic of a PWM signal having a pulse width corresponding to a time length of a driving period P2. The PWM signal has a pulse width corresponding to a drive voltage of the corresponding signal line. In a more specific example, the drive voltage of the signal line SL is a gradation voltage of a pixel driven by the signal line SL, and the PWM signal has a pulse width corresponding to the gradation voltage. That is, the PWM signal has a pulse width unique to every signal line SL.

The transistors M2 and M3 constituting the current control unit 185 have different conductivity types. For example, the transistor M2 is the p-type MOS transistor, and the transistor M3 is an n-type MOS transistor. The transistors M2 and M3 are turned on or off in synchronization. Furthermore, the transistor M2 constitutes a part of a source follower circuit.

The current holding unit 184 is provided to correspond to the signal line SL, and holds a current corresponding to a load of the signal line SL and a temporal change of a reference voltage. That is, the current holding unit 184 holds the current corresponding to a value obtained by multiplying the load of the corresponding signal line by a voltage change value per unit time of the reference voltage. The current holding unit 184 that holds the current in the first period (current sampling period) P1 functions as a constant current source that causes a substantially constant current to flow in the driving period (second period) illustrated in FIG. 4. Here, the load of the signal line SL is a parasitic capacitance of the signal line SL, and is a value unique to every signal line SL. That is, the load of the signal line SL is a value that may be different for every signal line SL. When the reference voltage is a ramp wave voltage whose voltage level linearly changes with time, a voltage change of the reference voltage becomes a constant value. Thus, as the current held by the current holding unit 184, a current having a different current level due to a difference in the parasitic capacitance of each of the signal lines SL is held for every signal line SL.

The current holding unit 184 includes a first transistor M1, a second transistor M5, a switch Aa, and a first capacitor C1.

The first capacitor C1 accumulates a charge corresponding to a current flowing within the first period P1. The first capacitor C1 accumulates the charge corresponding to the current output from the ramp wave generation circuit 181 (voltage follower circuit 182).

The first capacitor C1 is connected between a gate of the first transistor M1 and the switch Aa, and the ground.

The first transistor M1 continuously causes the current to flow through the signal line SL in the second period P2 on the basis of the accumulated charge of the first capacitor C1. The second period P2 is a period within the driving period illustrated in FIG. 4. Note that details of the second period P2 will be described later with reference to FIG. 4. The first transistor M1 is, for example, an n-type MOS transistor.

The first transistor M1 is connected between the second transistor M5 and the ground. The gate of the first transistor M1 is connected to the first capacitor C1, and is connected to the current control unit 185 and the second transistor M5 via the switch Aa.

The second transistor M5 is cascode-connected to the first transistor M1. Furthermore, the second transistor M5 is set to an on state from the first period P1 to the second period P2. The second transistor M5 is used to suppress a fluctuation in a voltage. The second transistor M5 is, for example, an n-type MOS transistor.

The second transistor M5 is connected between the current control unit 185 and the switch Aa, and the first transistor M1. For example, a gate of the second transistor M5 is biased to a voltage at which both the first transistor M1 and the second transistor M5 are turned on. For example, the second transistor M5 may be always in the on state. The bias voltage of the second transistor M5 is similarly set in the second transistors M5 for the other signal lines SL.

The switch Aa diode-connects the first transistor M1 in the first period P1.

The switch Aa is connected between the current control unit 185 and the second transistor M5, and the first capacitor C1 and the gate of the first transistor M1. When the switch Aa is turned on (in a closed state), the gate of the first transistor M1 and a drain of the first transistor M1 (drain of the second transistor M5) are connected, and thus, the first transistor M1 is diode-connected.

Furthermore, more specifically, the first capacitor C1 accumulates a charge corresponding to a current flowing through the diode-connected first transistor M1. Furthermore, more specifically, the switch Aa causes the charge corresponding to the current flowing through the diode-connected first transistor M1 and second transistor M5 to be accumulated in the first capacitor C1 in the first period P1. That is, the first capacitor C1 holds a voltage corresponding to a gate-source voltage of the diode-connected first transistor M1 in the first period P1.

The current control unit 185 causes a current to flow between the signal line SL and the current holding unit 184 in the second period P2 according to a drive voltage of the signal line SL. As described above, the load is the parasitic capacitance of the signal line SL.

The transistor M3 which is a part of the current control unit 185 has a gate into which a PWM signal having a pulse width corresponding to the drive voltage of the signal line is input, and causes a current corresponding to the current held by the current holding unit 184 to flow between the signal line SL and the current holding unit 184. The transistor M3 is, for example, the n-type MOS transistor.

The transistor M3 is connected between the current holding unit 184 and the signal line SL. That is, the transistor M3 is connected in parallel with the transistor M2.

The voltage setting unit 186 sets a voltage between the current control unit 185 and the current holding unit 184. For example, the voltage setting unit 186 sets the voltage between the current control unit 185 and the current holding unit 184 to a desired initial voltage. Therefore, the current control unit 185 can be more appropriately operated by the PWM signal.

The voltage setting unit 186 includes a transistor M4. The transistor M4 is, for example, a p-type MOS transistor.

The transistor M4 is connected between a power supply, and the current holding unit 184 and the current control unit 185. A power supply voltage is, for example, about 3 V to about 5 V. The transistor M4 and the reset unit 188 constitute an initial voltage setting unit that sets the signal line SL to a predetermined reference voltage (for example, power supply voltage) in a third period until the driving period (second period) P2 starts after a lapse of the first period P1.

Here, the current control unit 185 causes the current held by the current holding unit 184 to flow through the corresponding signal line SL in the second period P2 after the lapse of the first period P1, thereby generating the drive voltage of the signal line SL. As described above, the load of the signal line SL is the parasitic capacitance of the signal line SL, and is a value unique to every signal line SL. The drive voltage is a voltage determined by a pulse width of a PWM signal different for every signal line SL, and is a voltage different for every signal line SL.

The current holding unit 184 holds a current corresponding to the parasitic capacitance of the signal line SL. Therefore, the current control unit 185 causes the current held in the current holding unit 184 to flow through the signal line SL, so that the drive voltage that does not depend on the parasitic capacitance of each of the signal lines SL can be set in each of the signal lines SL.

The reset unit 188 resets the voltage of the signal line SL. The reset unit 188 includes a switch C.

The switch C is connected between the signal line SL and the ramp wiring 180. When the switch C is set in an on state, the switch C releases a charge accumulated in the parasitic capacitance of the signal line SL. Therefore, the signal line voltage is reset.

Next, an operation of the signal output unit 18 will be described.

Figure 4:
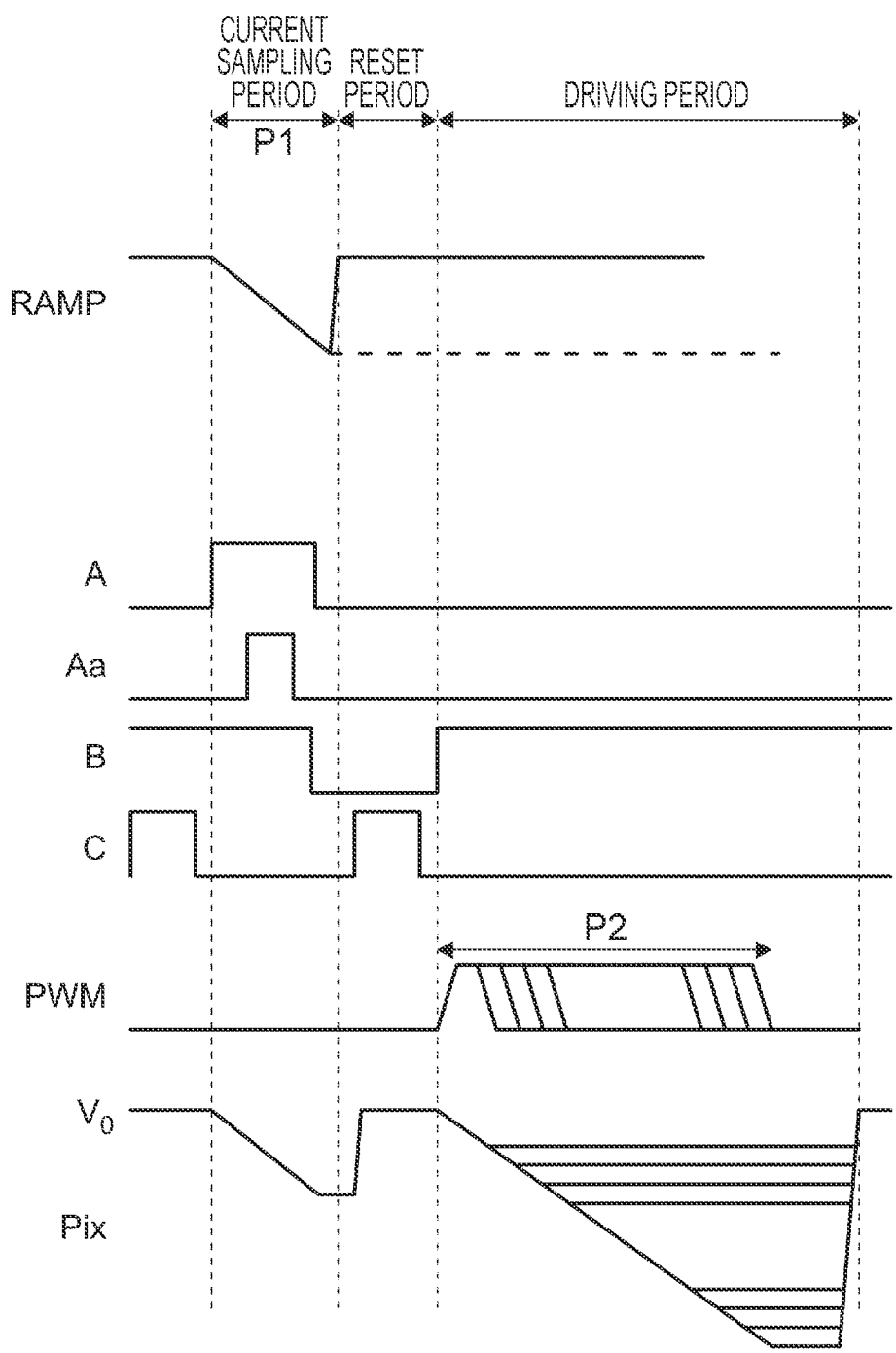
FIG. 4 is a timing chart illustrating an example of an operation of a signal output unit.

FIG. 4 is a timing chart illustrating an example of the operation of the signal output unit 18.

The current sampling period (first period P1) is a period in which the current holding unit 184 holds a current via the transistor M2 of the current control unit 185 functioning as the buffer unit. A reset period is a period in which the reset unit 188 resets a voltage of the signal line SL in the current sampling period. The driving period is a period in which the current control unit 185 causes a current to flow to generate a drive voltage of the signal line SL.

RAMP indicates a voltage output from the ramp wave generation circuit 181. Each of A and Aa indicate an on state or an off state of each of the switches A and Aa. A gate voltage of the transistor M4 of the voltage setting unit 186 is indicated by B. Note that the transistor M4 is in an off state in a case where the voltage B is at a high (H) level and is in an on state in a case where the voltage B is at a low (L) level. An on state or an off state of the switch C is indicated by C. A PWM signal input to the gate of the transistor M3 of the current control unit 185 is indicated by PWM. A voltage (signal line voltage) in the signal line SL is indicated by Pix. The maximum value of the signal line voltage Pix illustrated in FIG. 4 is, for example, a voltage slightly smaller than about 3 V to about 5 V which is the power supply voltage connected to the voltage setting unit 186. The minimum value of the signal line voltage Pix illustrated in FIG. 4 is, for example, about 1 V.

The timing chart illustrated in FIG. 4 is simultaneously executed in the plurality of signal lines. Furthermore, the pulse width (second period P2) of the PWM signal is different for every signal line. Therefore, the signal line is driven by the signal line voltage Pix unique to every signal line.

In an initial state before the current sampling period, the switch C is turned on. Furthermore, the voltage follower circuit 182 outputs a 0-gradation voltage $V_0$. Therefore, the signal line voltage Pix of the signal line SL is biased to the 0-gradation voltage $V_0$.

Next, after the switch C is turned off, the voltage follower circuit 182 outputs a ramp wave whose voltage changes with time at a constant slope. Furthermore, the switches A and Aa are turned on. Therefore, the transistor M2 performs a source follower operation, and the first transistor M1 and the second transistor M5 are diode-connected.

Here, assuming that a load capacitance of the signal line is Cp in a case where the voltage of the ramp wave changes by dV with respect to a time dt, a current I flowing through the transistor M2 is expressed by Formula 1.

$$I=Cp\times(dV/dt) \quad \text{(Formula 1)}$$

The magnitude of the current I is proportional to a slope (dV/dt) of the ramp wave voltage. The current I flows through the first transistor M1 in addition to the signal line SL. A gate voltage Vg at which a drain current becomes the current I is generated as a gate voltage of the first transistor M1. Note that the signal line voltage Pix illustrated in FIG. 4 is changed by the current flowing through the signal line SL.

Next, when the switches A and Aa are sequentially turned off, the gate voltage Vg of the first transistor M1 is held in the first capacitor C1.

Through the above operation, the gate voltage Vg is set to the first capacitor C1 simultaneously for the plurality of signal lines (channels) regardless of variations in the threshold voltage Vth, mobility, and the like of the transistors of the respective signal lines. The gate voltage Vg can generate the current I that causes changes in the respective signal lines with time by the slope (dV/dt) of the ramp wave voltage. Note that the current held by the current holding unit 184 depends on the load capacitance Cp which is the parasitic capacitance of each signal line as shown in Formula 1.

Furthermore, there is a case where a delay and a voltage difference occur in the ramp wave voltages of the respective signal lines depending on a distance from the voltage follower circuit 182 to each signal line due to a wiring resistance and a parasitic capacitance of the ramp wiring 180. However, the slope itself of the ramp wave voltage is substantially constant regardless of the location. Therefore, the current holding unit 184 can hold a substantially constant current in each signal line by suppressing the influence of the wiring resistance and the parasitic capacitance of the ramp wiring 180. As a result, it is unnecessary to increase a wiring width in order to reduce the wiring resistance, and mounting can be performed with a small area.

The reset period is a period during which a state in which a ramp wave is written at the signal line voltage Pix in the current sampling period is set to the initial state before the driving period.

First, the voltage B becomes the L level, and the switch C is turned on. Therefore, the voltage of the ramp wiring 180 and a source voltage and a drain voltage of the transistor M2 are set to the 0-gradation voltage $V_0$. Note that a timing at which the switch A is turned off and a timing at which the voltage B becomes the L level are substantially synchronized with each other. However, any one of the timings may be slightly earlier than the other timing.

The driving period is an operation of writing a signal voltage (drive voltage) to the signal line SL using the constant current source set in the current sampling period and the PWM signal whose pulse width changes according to display data.

First, the switch C is turned off, the voltage B becomes the H level, the PWM level becomes the H level, and the xPWM level becomes the L level, and then, the PWM signal becomes the L level after time T according to the display data elapses, and the xPWM becomes the H level. Therefore, the signal line voltage Pix of $V_0-(dV/dt)\times T$ is written in the signal line SL.

That is, the second period P2 has a time length according to the drive voltage of the signal line SL, and is specified by the pulse width of the PWM signal. Furthermore, the current control unit 185 generates the drive voltage of the signal line SL by continuously causing the current to flow through the signal line SL in the second period P2. The second period P2 corresponds to the time T. Therefore, the signal line voltage Pix increases as the second period P2 decreases. On the other hand, the signal line voltage Pix decreases as the second period P2 increases.

In the driving period, the current flows from the current holding unit 184 to the signal line SL via the transistors M2 and M3 of the current control unit 185. Therefore, current output by the ramp wave generation circuit 181 and the voltage follower circuit 182 is not required in the driving period. The voltage follower circuit 182 is an amplifier circuit that requires a bias current. Therefore, in a period other than the current sampling period, it is unnecessary to cause the bias current of the voltage follower circuit 182 to flow, and only the minimum current required to drive the signal line is consumed, so that power consumption can be suppressed.

Furthermore, a voltage written in each signal line is subjected to current setting by the operation in the current sampling period described above. Therefore, the influence of a variation in the current source in the current holding unit 184 and a variation in the parasitic capacitance of the ramp wiring 180 can be suppressed, and the signal line voltage at which a deviation between the signal lines is suppressed can be generated.

Next, an operation of the display device 1 illustrated in FIG. 2 will be described.

Figure 5:
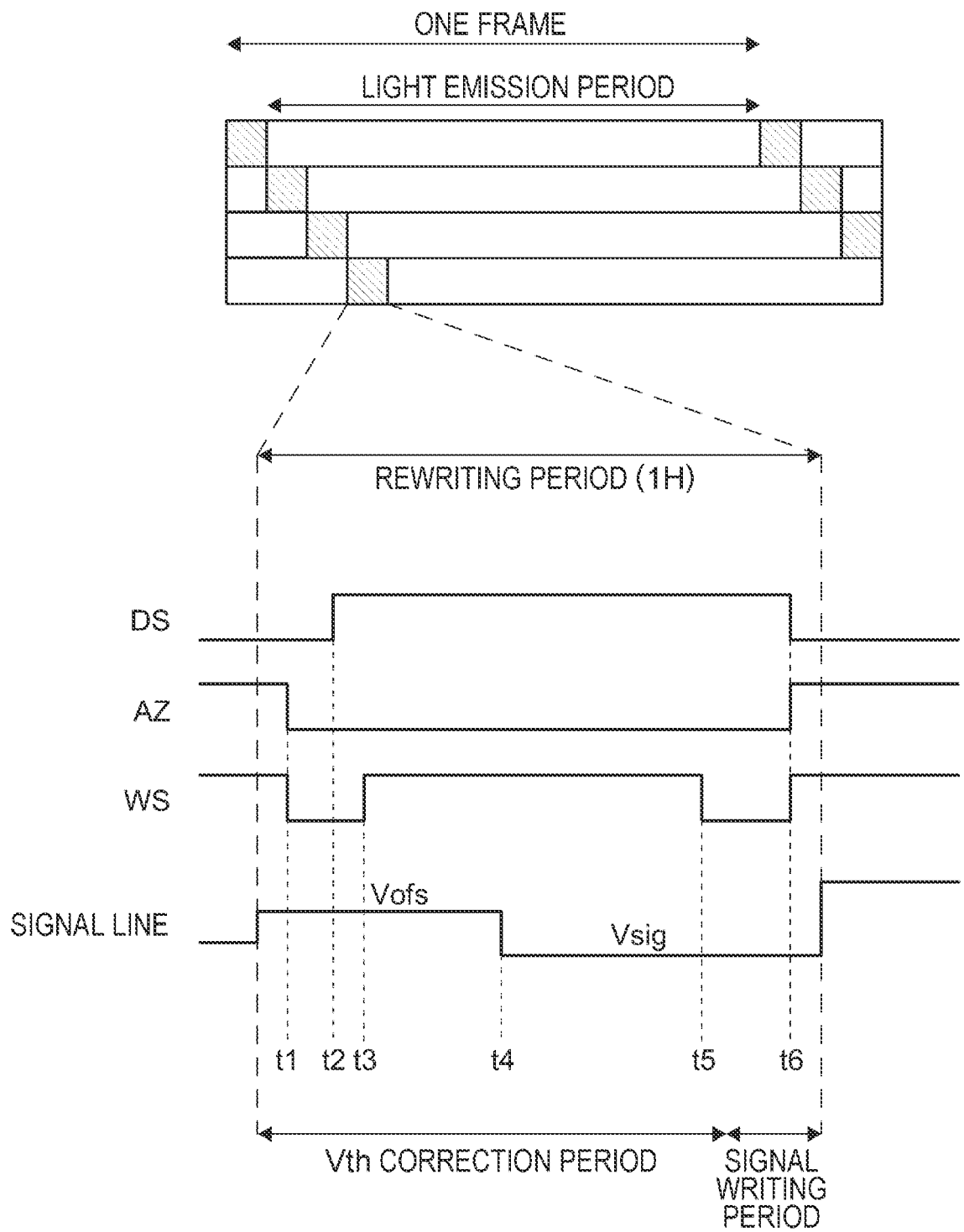
FIG. 5 is a timing chart illustrating an example of an operation of the display device.

FIG. 5 is a timing chart illustrating an example of the operation of display device 1.

The signal line drive circuit 12 generates drive voltages of all signal lines each time the write scan unit 16 drives one scan line. A plurality of the scan lines is provided in one frame, and a plurality of pixels connected to one scan line is referred to as one horizontal line (1H). FIG. 5 illustrates a timing chart of representative signals in a pixel circuit in a case where all pixels in one frame are sequentially driven for every horizontal line. The signal DS is a gate signal of the light emission control transistor 44. The signal AZ is a gate signal of the switching transistor 48. A signal WS is a gate signal of the sampling transistor 43.

Hereinafter, an operation of the pixel circuit of FIG. 2 will be described on the basis of the timing chart of FIG. 5. First, since the signal AZ transitions from high to low at a time t1, the switching transistor 48 is turned on, and light emission of the light emitting unit 41 is stopped. Furthermore, the sampling transistor 43 is turned on, and the offset voltage Vofs on the signal line is supplied to one end of the holding capacitance 45. At this time, the light emission control transistor 44 is turned on, and the power supply voltage Vcc is supplied to the other end of the holding capacitance 45. Thus, a voltage of (Vcc−Vofs) is applied to both ends of the holding capacitance 45.

Thereafter, the light emission control transistor 44 is turned off at a time t2. Therefore, some of charges accumulated in the holding capacitance 45 moves to the auxiliary capacitance 46, and the charges are distributed. Specifically, a charge corresponding to a threshold voltage of the driving transistor 42 is accumulated in the holding capacitance 45.

Thereafter, the sampling transistor 43 is turned off at a time t3. Thereafter, the signal line voltage Vsig is supplied onto the signal line at a time t4. Thereafter, at a time t5, the sampling transistor 43 is turned on, and the signal line voltage Vsig is supplied to the gate of the driving transistor 42. Since correction corresponding to the threshold voltage of the driving transistor 42 is performed by the holding capacitance 45, a voltage obtained by performing offset correction and the threshold correction with respect to the signal line voltage Vsig is applied between the gate and the source of the driving transistor 42.

Thereafter, at a time t6, the light emission control transistor 44 is turned on and the switching transistor 48 is turned off, a voltage according to the signal line voltage Vsig is applied to an anode of the light emitting unit 41, and the light emitting unit 41 emits light with light emission luminance according to such an anode voltage.

As illustrated in FIG. 5, the operations in the current sampling period, the reset period, and the driving period are preferably executed for every horizontal line (1H) which is a rewriting period. This is because there is a case where the signal line voltage is shifted due to noise of a switch by one-time driving since a current value is stored in the first capacitor C1.

Note that ramp wave driving for current sampling and writing of the offset voltage Vofs may be performed together.

As described above, the ramp wave generation circuit 181 generates the reference voltage (ramp wave voltage) whose voltage level changes with time according to the first embodiment. Furthermore, the current holding unit 184 provided to correspond to the signal line SL holds the current corresponding to the temporal change of the ramp wave voltage.

Therefore, the current can be replicated with higher accuracy for the plurality of signal lines. That is, substantially the same current value is held in each of the plurality of current holding units 184. Therefore, the signal line voltage Pix in the driving period changes at substantially the same slope in each of the signal lines. As a result, it is possible to suppress a variation in the signal line voltage of each of the signal lines. Therefore, a desired drive voltage can be written to each of the signal lines by setting a PWM pulse width corresponding to a gradation for each of the pixel circuits 15. As a result, a variation in luminance of the display device 1 can be suppressed, and deterioration of the display quality can be suppressed.

As another method of replicating a current value, for example, a current mirror circuit is known. In the current mirror circuit, however, there is a case where a variation in a current occurs due to a variation in an element characteristic of a transistor. Furthermore, a variation in the parasitic capacitance of each of the signal lines causes a variation in a signal line voltage between the signal lines.

Figure 6:
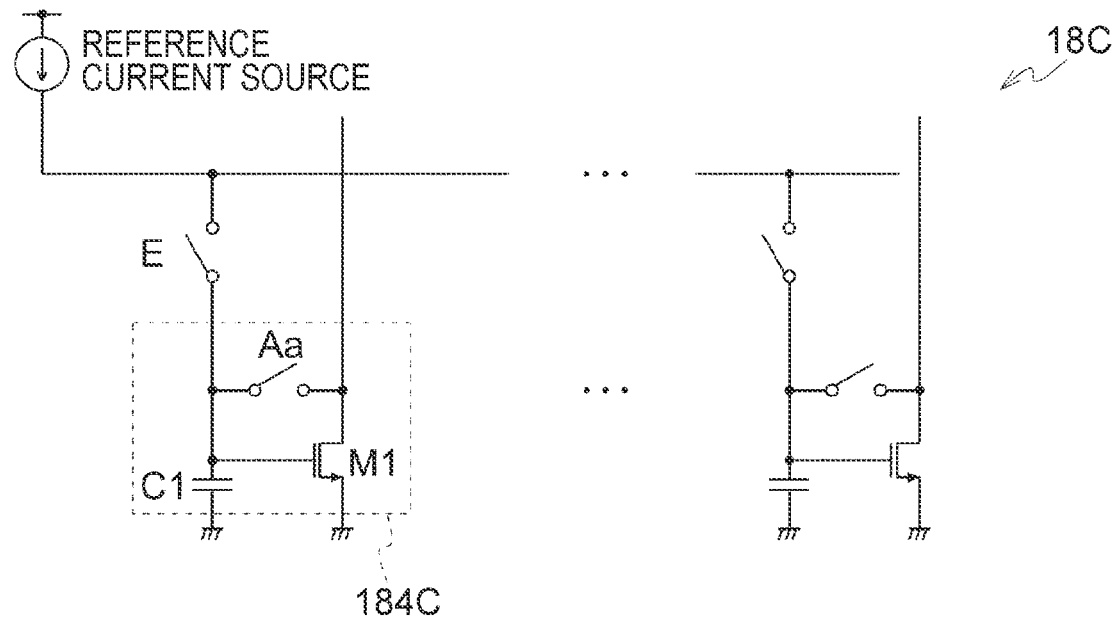
FIG. 6 is a circuit diagram illustrating an example of internal configurations of a signal output unit and a current holding unit according to a comparative example.

FIG. 6 is a circuit diagram illustrating an example of an internal configuration of a signal output unit 18C and a current holding unit 184C according to a comparative example. FIG. 6 is a diagram for describing a current sampling circuit as another method of replicating a current value. In the comparative example illustrated in FIG. 6, a reference current source is provided instead of the ramp wave generation circuit 181.

The current holding unit 184C illustrated in FIG. 6 may be substantially similar to the current holding unit 184 illustrated in FIG. 3. In the example illustrated in FIG. 6, the current holding unit 184C is connected to the reference current source via a switch E on a current input side. The current holding unit 184C is connected to the transistor M3 (not illustrated) of the current control unit 185 on a current output side.

The current sampling circuit illustrated in FIG. 6 can replicate a current of the reference current source with high accuracy. However, it is difficult to simultaneously replicate the current for a plurality of signal lines. Therefore, it is necessary to sequentially replicate the current of the reference current source one by one in the current holding unit 184C in each of the signal lines, which takes time. Furthermore, a higher-definition panel requires a longer time for the current replication. Furthermore, a variation in a parasitic capacitance of each of the signal lines causes a variation in a signal line voltage between the signal lines, which is similar to the current mirror circuit.

In contrast to the current mirror circuit described above and the current sampling circuit illustrated in FIG. 6, the plurality of current holding units 184 in the first embodiment holds currents output from the ramp wave generation circuit 181 in parallel. Note that the plurality of current holding units 184 is provided to correspond to the plurality of signal lines SL. Therefore, it is possible to set the current value of the constant current source by simultaneously performing voltage driving with the ramp waveform for all the signal lines (channels) and simultaneously performing current sampling of the current flowing at that time on each of the signal lines. Therefore, the current can simultaneously be replicated for the plurality of signal lines, and the current can more accurately be set in a shorter time. Furthermore, it is only necessary to add the switch and the capacitor to each of the signal lines, and the mounting can be performed with the small area. Furthermore, the current value of the constant current source is a current value according to a parasitic capacitance value of each of the signal lines. When the current flowing from the constant current source is converted into the drive voltage by the parasitic capacitance, the influence of the parasitic capacitance is canceled. Therefore, a variation in the signal voltage between the signal lines due to the variation in the parasitic capacitance can be suppressed.

Note that the ramp wave voltage changes to the negative side in the example illustrated in FIG. 4. However, the ramp wave voltage may change to the positive side without being limited thereto. In this case, the transistors M1 to M5 illustrated in FIG. 3 are only required to be MOS transistors of opposite polarities, respectively.

Modified Example

Figure 7:
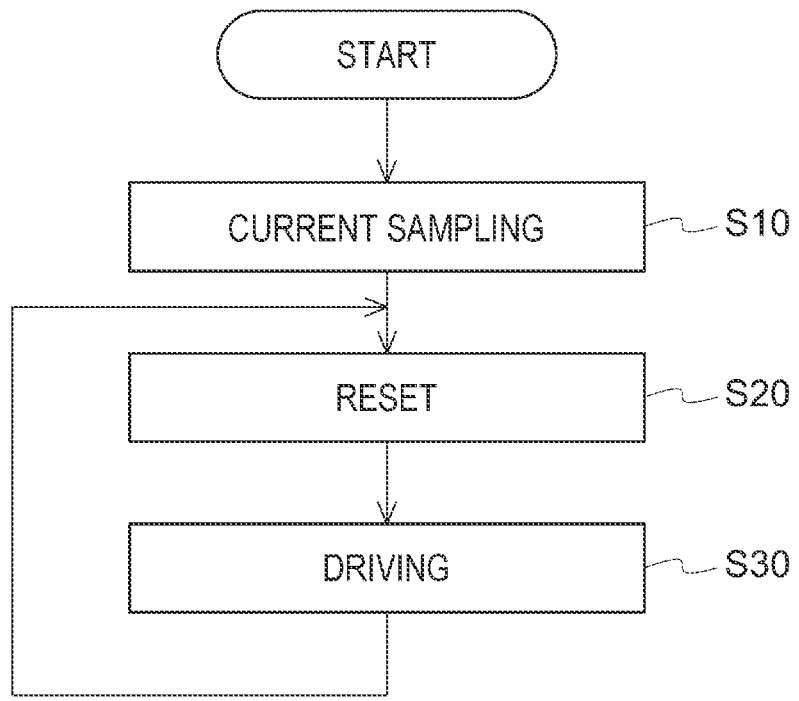
FIG. 7 is a flowchart illustrating an example of an operation of a signal output unit according to a modified example.

FIG. 7 is a flowchart illustrating an example of an operation of the signal output unit 18 according to a modified example. The modified example is different from the first embodiment in that an operation in a current sampling period is not executed for every horizontal line (each H).

In the example illustrated in FIG. 7, a reset period (S20) and a driving period (S30) are repeated after the current sampling period (S10). For example, a common current value obtained by the operation in the current sampling period (S10) performed once is used for one frame illustrated in FIG. 5. On the other hand, operations in the reset period (S20) and the driving period (S30) are repeatedly executed for every horizontal line similarly to the first embodiment in order to change the signal line voltage Vsig for every horizontal line in one frame.

In this manner, the driving period may be executed a plurality of times after setting of the current if there is no need to change the set value (current value of the current holding unit 184) after the current sampling period. Since the operation in the current sampling period requires large power consumption, the power consumption can be further suppressed by reducing the number of times of the current sampling period.

The other configurations of the signal line drive circuit 12 according to the modified example are similar to the corresponding configurations of the signal line drive circuit 12 according to the first embodiment, and thus, the detailed description thereof will be omitted. The signal line drive circuit 12 according to the modified example can obtain effects similar to those of the first embodiment.

Second Embodiment

Figure 8:
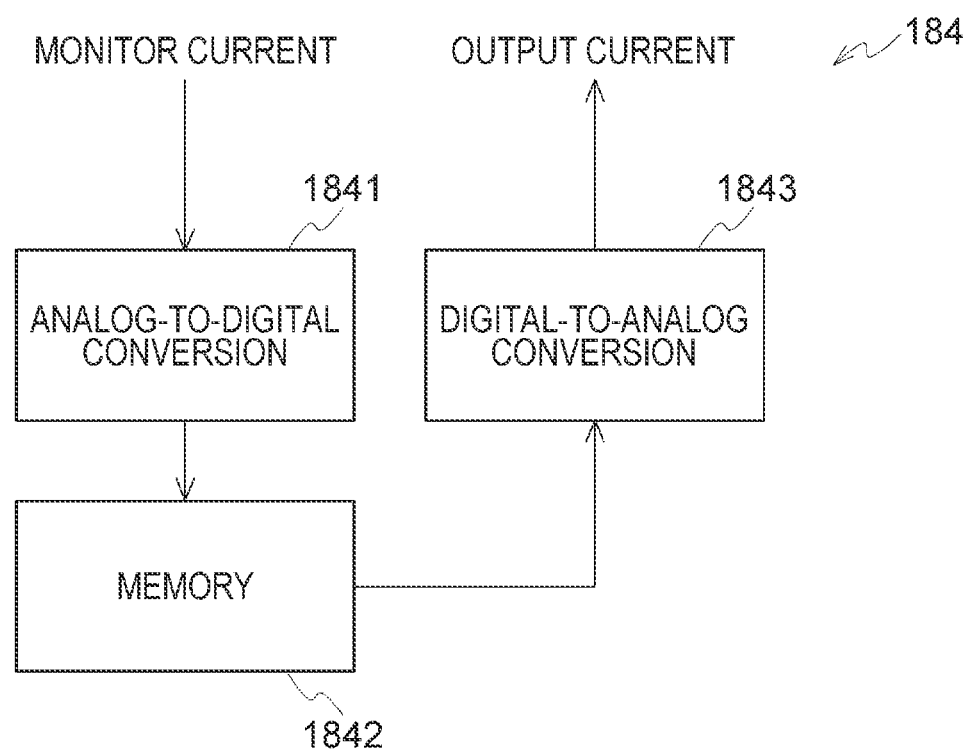
FIG. 8 is a block diagram illustrating an example of an internal configuration of a current holding unit according to a second embodiment.

FIG. 8 is a block diagram illustrating an example of a configuration of the current holding unit 184 according to a second embodiment.

The current holding unit 184 includes an analog-to-digital converter (ADC) 1841, a memory 1842, and a digital-to-analog converter (DAC) 1843.

The ADC 184 as an analog-to-digital conversion unit converts a current corresponding to a temporal change of the reference voltage into a digital value.

The memory 1842 as a current storage unit stores the digital value. The memory 1842 may be, for example, a volatile memory such as a static random access memory (SRAM) or a latch.

The DAC 1843 as a digital-to-analog conversion unit converts the digital value stored in the memory 1842 into a current.

Furthermore, the current control unit 185 causes the current converted by the DAC 1843 to flow through a corresponding signal line SL to generate a drive voltage of the signal line SL. More specifically, the current control unit 185 generates the drive voltage of the signal line SL on the basis of the current converted by the DAC 1843 and a time length of the driving period (second period) P2.

In the second embodiment, the first capacitor C1 can be omitted, and a fluctuation of the set current due to leakage of the first capacitor C1 can be suppressed. That is, it is possible to suppress the influence of noise generated by one-time driving described in the first embodiment. As a result, the operation in the current sampling period does not need to be executed for every horizontal line (every H), and may be executed, for example, in units of frames as described in the modified example.

The other configurations of the signal line drive circuit 12 according to the second embodiment are similar to the corresponding configurations of the signal line drive circuit 12 according to the first embodiment, and thus, the detailed description thereof will be omitted. The signal line drive circuit 12 according to the second embodiment can obtain effects similar to those of the first embodiment. Furthermore, the modified example may be combined with the signal line drive circuit 12 according to the second embodiment.

Note that the present technology can have the following configurations.

(1) A signal line drive circuit driving a plurality of signal lines, the signal line drive circuit including:

a reference voltage generation unit that generates a reference voltage whose voltage level changes with time in a first period before the plurality of signal lines is driven;

a current holding unit that is provided to correspond to the signal line and holds a current corresponding to a load of the signal line and a temporal change of the reference voltage; and a current control unit that causes the current held by the current holding unit to flow through the corresponding signal line in a second period after a lapse of the first period to generate a drive voltage of the signal line.

(2) The signal line drive circuit according to (1), in which the current holding unit and the current control unit are provided for each of the plurality of signal lines.

(3) The signal line drive circuit according to (1) or (2), in which the current holding unit holds the current corresponding to a value obtained by multiplying the load of the corresponding signal line by a voltage change value per unit time of the reference voltage.

(4) The signal line drive circuit according to any one of (1) to (3), in which the reference voltage generation unit generates the reference voltage whose voltage level changes linearly with time in the first period, and generates the reference voltage whose voltage level is constant in the second period.

(5) The signal line drive circuit according to any one of (1) to (4), in which the second period has a time length unique to each of the signal lines, and the current control unit causes the current to continuously flow through signal line in the second period to generate the drive voltage of the signal line.

(6) The signal line drive circuit according to any one of (3) to (5), in which the current control unit switches whether or not to cause the current held in the current holding unit to flow through the corresponding signal line in accordance with logic of a pulse width modulation signal having a pulse width corresponding to a time length of the second period.

(7) The signal line drive circuit according to (6), in which the pulse width modulation signal has a pulse width corresponding to the drive voltage of the corresponding signal line.

(8) The signal line drive circuit according to (7), in which the drive voltage of the signal line is a gradation voltage of a pixel driven by the signal line, and the pulse width modulation signal has a pulse width corresponding to the gradation voltage.

(9) The signal line drive circuit according to any one of (6) to (8), in which the current control unit includes two transistors which are connected in parallel, have conductivity types different from each other, and are turned on or off in synchronization with each other.

(10) The signal line drive circuit according to (9), in which one of the two transistors forms a part of a source follower circuit.

(11) The signal line drive circuit according to any one of (5) to (10), in which the current holding unit includes:

a first capacitor that accumulates a charge corresponding to the current flowing in the first period; and a first transistor that causes the current to continuously flow through the signal line in the second period on the basis of the accumulated charge of the first capacitor.

(12) The signal line drive circuit according to (11), in which the current holding unit further includes a switch that diode-connects the first transistor in the first period, and the first capacitor accumulates a charge corresponding to the current flowing through the diode-connected first transistor.

(13) The signal line drive circuit according to (12), in which the current holding unit further includes a second transistor cascode-connected to the first transistor, the second transistor is set to an on state from the first period to the second period, and the switch accumulates a charge, which corresponds to a current flowing through the diode-connected first transistor and second transistor, in the first capacitor in the first period.

(14) The signal line drive circuit according to any one of (1) to (10), in which the current holding unit includes:

an analog-to-digital conversion unit that converts the current corresponding to the temporal change of the reference voltage into a digital value;

a current storage unit that stores the digital value; and a digital-to-analog conversion unit that converts the digital value stored in the current storage unit into the current, and the current control unit causes the current converted by the digital-to-analog conversion unit to flow through the corresponding signal line to generate the drive voltage of the signal line.

(15) The signal line drive circuit according to any one of (1) to (14), in which a plurality of the current holding units is provided to correspond to the plurality of signal lines, and the plurality of current holding units holds currents output from the reference voltage generation unit in parallel.

(16) The signal line drive circuit according to any one of (1) to (15), further including a voltage follower circuit that is connected between the reference voltage generation unit and the current holding unit and supplies the reference voltage to the current holding unit in the first period.

(17) The signal line drive circuit according to any one of (1) to (16), further including an initial voltage setting unit that sets the signal line to a predetermined reference voltage in a third period until the second period starts after a lapse of the first period.

(18) The signal line drive circuit according to any one of (1) to (17), in which the load is a parasitic capacitance of each of the signal lines.

Aspects of the present disclosure are not limited to the above-described respective embodiments, but include various modifications that can be conceived by those skilled in the art, and effects of the present disclosure are not limited to the above-described contents. That is, various additions, changes, and partial deletions can be made within a scope not departing from a conceptual idea and a spirit of the present disclosure derived from the contents defined in the claims and equivalents thereof.

REFERENCE SIGNS LIST

1 Display device
12 Signal line drive circuit
15 Pixel circuit
18 Signal output unit
181 Ramp wave generation circuit
182 Voltage follower circuit
184 Current holding unit
185 Current control unit
Aa Switch
C1 First capacitor
M1 First transistor
M5 Second transistor
M3 Transistor
Pix Signal line voltage
P1 First period
P2 Second period
SL Signal line
Vsig Signal line voltage

The invention claimed is:

1. A signal line drive circuit driving a plurality of signal lines, the signal line drive circuit comprising:
   a reference voltage generation unit that generates a reference voltage whose voltage level changes with time in a first period before the plurality of signal lines is driven;
   a current holding unit that is provided to correspond to the signal line and holds a current corresponding to a load of the signal line and a temporal change of the reference voltage; and
   a current control unit that causes the current held by the current holding unit to flow through the corresponding signal line in a second period after a lapse of the first period to generate a drive voltage of the signal line.

2. The signal line drive circuit according to claim 1, wherein the current holding unit and the current control unit are provided for each of the plurality of signal lines.

3. The signal line drive circuit according to claim 1, wherein the current holding unit holds the current corresponding to a value obtained by multiplying the load of the corresponding signal line by a voltage change value per unit time of the reference voltage.

4. The signal line drive circuit according to claim 1, wherein the reference voltage generation unit generates the reference voltage whose voltage level changes linearly with time in the first period, and generates the reference voltage whose voltage level is constant in the second period.

5. The signal line drive circuit according to claim 1, wherein
   the second period has a time length unique to each of the signal lines, and
   the current control unit causes the current to continuously flow through signal line in the second period to generate the drive voltage of the signal line.

6. The signal line drive circuit according to claim 3, wherein the current control unit switches whether or not to cause the current held in the current holding unit to flow through the corresponding signal line in accordance with logic of a pulse width modulation signal having a pulse width corresponding to a time length of the second period.

7. The signal line drive circuit according to claim 6, wherein the pulse width modulation signal has a pulse width corresponding to the drive voltage of the corresponding signal line.

8. The signal line drive circuit according to claim 7, wherein
   the drive voltage of the signal line is a gradation voltage of a pixel driven by the signal line, and
   the pulse width modulation signal has a pulse width corresponding to the gradation voltage.

9. The signal line drive circuit according to claim 6, wherein the current control unit includes two transistors which are connected in parallel, have conductivity types different from each other, and are turned on or off in synchronization with each other.

10. The signal line drive circuit according to claim 9, wherein one of the two transistors forms a part of a source follower circuit.

11. The signal line drive circuit according to claim 5, wherein
the current holding unit includes:
a first capacitor that accumulates a charge corresponding to the current flowing in the first period; and
a first transistor that causes the current to continuously flow through the signal line in the second period on a basis of the accumulated charge of the first capacitor.

12. The signal line drive circuit according to claim 11, wherein
the current holding unit further includes a switch that diode-connects the first transistor in the first period, and
the first capacitor accumulates a charge corresponding to the current flowing through the diode-connected first transistor.

13. The signal line drive circuit according to claim 12, wherein
the current holding unit further includes a second transistor cascode-connected to the first transistor,
the second transistor is set to an on state from the first period to the second period, and
the switch accumulates a charge, which corresponds to a current flowing through the diode-connected first transistor and second transistor, in the first capacitor in the first period.

14. The signal line drive circuit according to claim 1, wherein
the current holding unit includes:
an analog-to-digital conversion unit that converts the current corresponding to the temporal change of the reference voltage into a digital value;
a current storage unit that stores the digital value; and
a digital-to-analog conversion unit that converts the digital value stored in the current storage unit into the current, and
the current control unit causes the current converted by the digital-to-analog conversion unit to flow through the corresponding signal line to generate the drive voltage of the signal line.

15. The signal line drive circuit according to claim 1, wherein
a plurality of the current holding units is provided to correspond to the plurality of signal lines, and
the plurality of current holding units holds currents output from the reference voltage generation unit in parallel.

16. The signal line drive circuit according to claim 1, further comprising a voltage follower circuit that is connected between the reference voltage generation unit and the current holding unit and supplies the reference voltage to the current holding unit in the first period.

17. The signal line drive circuit according to claim 1, further comprising an initial voltage setting unit that sets the signal line to a predetermined reference voltage in a third period until the second period starts after a lapse of the first period.

18. The signal line drive circuit according to claim 1, wherein the load is a parasitic capacitance of each of the signal lines.

* * * * *